(12) United States Patent
Morin et al.

(10) Patent No.: US 10,403,682 B2
(45) Date of Patent: Sep. 3, 2019

(54) PHASE-CHANGE MEMORY

(71) Applicant: STMicroelectronics (Crolles 2) SAS, Crolles (FR)

(72) Inventors: Pierre Morin, Grenoble (FR); Philippe Brun, Meylan (FR); Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/968,474

(22) Filed: May 1, 2018

(65) Prior Publication Data
US 2018/0323237 A1 Nov. 8, 2018

(30) Foreign Application Priority Data
May 5, 2017 (FR) .................................... 17 53985

(51) Int. Cl.
*H01L 27/24* (2006.01)
*H01L 45/00* (2006.01)
(Continued)

(52) U.S. Cl.
CPC ...... *H01L 27/2463* (2013.01); *H01L 21/0217* (2013.01); *H01L 21/02178* (2013.01); *H01L 21/76802* (2013.01); *H01L 21/76843* (2013.01); *H01L 21/76877* (2013.01); *H01L 21/76895* (2013.01); *H01L 23/528* (2013.01); *H01L 23/5226* (2013.01); *H01L 23/5329* (2013.01); *H01L 23/53238* (2013.01);
(Continued)

(58) Field of Classification Search
CPC ........... H01L 27/2463; H01L 21/02178; H01L 21/76802; H01L 21/76895; H01L 21/76843; H01L 21/76877; H01L 21/0217; H01L 23/5226; H01L 23/5329; H01L 23/528; H01L 23/53238; H01L 45/06; H01L 45/1233
See application file for complete search history.

(56) References Cited

U.S. PATENT DOCUMENTS 8,243,497 B1 * 8/2012 Pellizzer .................. G11C 8/14
365/100
2006/0011959 A1 * 1/2006 Park ....................... B82Y 10/00
257/295
(Continued)

FOREIGN PATENT DOCUMENTS

EP 2105959 A2 9/2009

OTHER PUBLICATIONS

Horii et al., "A Novel Cell Technology Using N-doped GeSbTe Films for Phase Change RAM", VLSI, 2003 (2 pages).*
(Continued)

*Primary Examiner* — Ahmed N Sefer
(74) *Attorney, Agent, or Firm* — Crowe & Dunlevy

(57) ABSTRACT

A phase-change memory includes a strip of phase-change material that is coated with a conductive strip and surrounded by an insulator. The strip of phase-change material has a lower face in contact with tips of a resistive element. A connection network composed of several levels of metallization coupled with one another by conducting vias is provided above the conductive strip. At least one element of a lower level of the metallization is in direct contact with the upper surface of the conductive strip.

12 Claims, 3 Drawing Sheets

(51) Int. Cl.
  *H01L 23/528* (2006.01)
  *H01L 23/522* (2006.01)
  *H01L 23/532* (2006.01)
  *H01L 21/02* (2006.01)
  *H01L 21/768* (2006.01)
(52) U.S. Cl.
  CPC .......... *H01L 27/2472* (2013.01); *H01L 45/06* (2013.01); *H01L 45/126* (2013.01); *H01L 45/1233* (2013.01); *H01L 45/144* (2013.01)

(56) References Cited

U.S. PATENT DOCUMENTS

| | | | | |
|---|---|---|---|---|
| 2006/0113521 A1* | 6/2006 | Lung | ...................... | H01L 45/06 257/4 |
| 2008/0113469 A1* | 5/2008 | Eun | ........................ | H01L 45/06 438/102 |
| 2009/0230376 A1 | 9/2009 | Ryoo | | |
| 2009/0230378 A1* | 9/2009 | Ryoo | ................... | G11C 11/5664 257/4 |
| 2012/0322223 A1* | 12/2012 | Oh | .......................... | H01L 45/06 438/382 |
| 2013/0280882 A1* | 10/2013 | Hwang | ................... | H01L 45/00 438/382 |
| 2014/0217353 A1* | 8/2014 | Herner | ................... | H01L 45/16 257/5 |
| 2015/0214479 A1* | 7/2015 | Lung | ...................... | H01L 45/06 365/163 |

OTHER PUBLICATIONS

INPI Search Report and Written Opinion for FR 1753985 dated Jan. 8, 2018 (8 pages).

* cited by examiner

PHASE-CHANGE MEMORY

PRIORITY CLAIM

This application claims the priority benefit of French Application for Patent No. 1753985, filed on May 5, 2017, the disclosure of which is hereby incorporated by reference in its entirety to the maximum extent allowable by law.

TECHNICAL FIELD

The present application relates to phase-change memories and, more particularly, the connection of a phase-change memory to a connection network.

BACKGROUND

Phase-change materials are materials that can switch, under the effect of heat, between a crystalline phase and an amorphous phase. Since the electrical resistance of an amorphous material is significantly higher than the electrical resistance of a crystalline material, this phenomenon can be useful for defining two memory states, for example 0 and 1, differentiated by the resistance measured across the phase-change material.

SUMMARY

Thus, one embodiment provides a phase-change memory comprising: a strip of phase-change material coated with a conductive strip and surrounded by an insulator, the strip of phase-change material being in contact via its lower face with tips of resistive elements; and a connection network composed of several levels of metallization coupled with one another by conducting vias, at least one element of the lower metallization level being in direct contact with the upper face of the conductive strip.

According to one embodiment, the elements of the lower metallization level comprise a cladding made of tantalum nitride and a core made of copper.

According to one embodiment, said insulator is silicon nitride.

Another embodiment provides a method of fabrication of a phase-change memory comprising: uncovering the upper face of a conductive strip covering a strip of phase-change material, the strip of phase-change material being surrounded by at least a first insulator and in contact via its lower face with tips of resistive elements; depositing an etch-stop layer on the structure; and forming at least one element of the lower metallization level of a connection network within the etch-stop layer, in direct contact with the conductive strip.

According to one embodiment, the formation of the element of the lower metallization level comprises: forming a cavity in the etch-stop layer as far as the conductive strip; and filling the cavity with one or more metal materials.

According to one embodiment, the etch-stop layer is made of a second insulating material whose etching is highly selective with respect to the first insulator surrounding the layer of phase-change material.

According to one embodiment, the first insulator is silicon nitride and the etch-stop layer is made of a material chosen within the group comprising $Al_2O_3$ and AlN.

According to one embodiment, the thickness of the etch-stop layer is in the range between 5 and 10 nm.

According to one embodiment, the cavity is filled with a cladding made of tantalum nitride and with a core made of copper.

BRIEF DESCRIPTION OF THE DRAWINGS

These features and advantages, together with others, will be presented in detail in the following description of particular embodiments, by way of non-limiting example, in relation to the appended figures, amongst which.

DETAILED DESCRIPTION

The same elements have been identified by the same references in the various figures and, in addition, the various figures are not drawn to scale. For the sake of clarity, only the elements useful to the understanding of the embodiments described have been shown and are detailed. In particular, the selector transistors controlling the elements of a phase-change memory are neither shown nor described.

In the description that follows, when reference is made to terms such as "upper", "lower", etc., reference is being made to the orientation of the elements concerned in the figures. Unless otherwise stated, the expression "substantially" means to the nearest 10%, preferably the nearest 5%.

Figure 1:
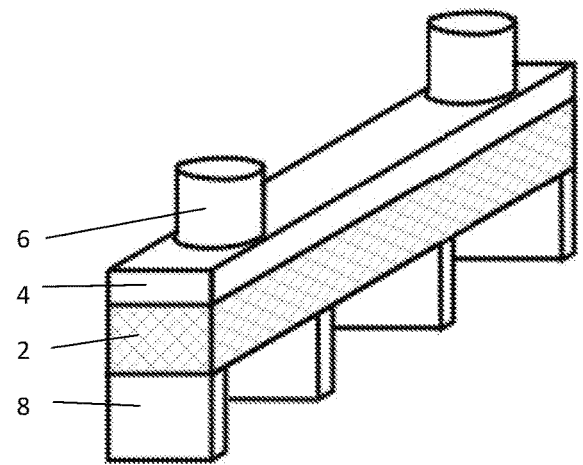
FIG. 1 is a perspective view of elements of a phase-change memory.

FIG. 1 is a perspective view of a row portion of a phase-change memory. One row of a phase-change memory comprises a strip 2 of phase-change material. The upper face of the strip 2 is in contact with a strip 4 of conductive material of the same width as the strip 2. Conducting vias 6, in contact with the upper face of the strip 4 of conductive material, connect the strip 4 to a source of voltage allowing a uniform voltage to be maintained in the strip of conductive material 4. This connection is made via a connection network, not shown, comprising several levels of metallization connected to one another by conducting vias.

The lower face of the strip 2 of phase-change material is in contact with the upper ends, or tips, of resistive elements 8, four of which are shown in FIG. 1. These resistive elements 8 are connected, by conducting vias not shown, to drain/source regions of selector transistors not shown. The resistive elements 8 are spaced out from one another in a substantially regular manner.

The memory row previously described is surrounded by various insulators not shown, with the exception of the upper ends of the vias 6 and of the lower parts of the resistive elements 8.

The phase-change material is, for example, a chalcogenide such as $Ge_2Sb_2Te_5$ or GST. The phase-change material may also be a compound comprising germanium, antimony and tellurium in different proportions and potentially doped with atoms of nitrogen, oxygen and/or carbon.

The strip 4 of conductive material is, for example, made of titanium nitride and/or tungsten.

The conducting vias 6 are, for example, clad in a layer of titanium nitride and filled with tungsten.

The resistive elements 8 are, for example, made of a material containing titanium nitride and potentially comprising silicon and carbon.

Figure 2A:
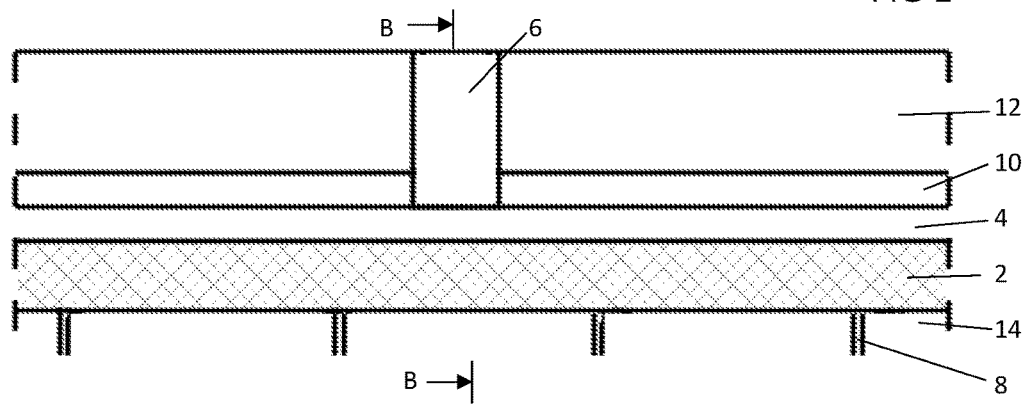
FIGS. 2A and 2B are cross-sectional views in two orthogonal directions of elements of a phase-change memory.
Figure 2B:
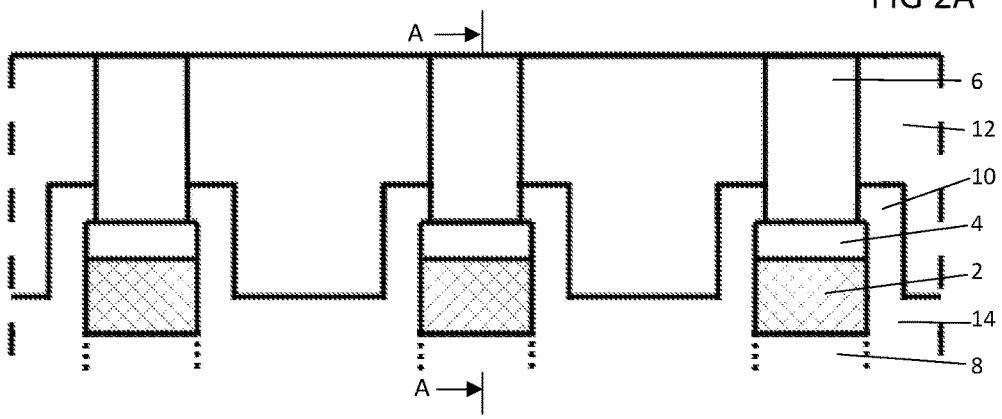

FIGS. 2A and 2B show a phase-change memory in more detail. FIG. 2B is a cross-sectional view along the line B-B in FIG. 2A and FIG. 2A is a cross-sectional view along the line A-A in FIG. 2B.

FIG. 2A is a cross-sectional view in the direction of a row of a phase-change memory and comprises the elements described in relation to FIG. 1, in other words: a strip 2 of phase-change material covered by a strip 4 of conductive material, a conducting via 6 and four resistive elements 8.

The strip 4 of conductive material is covered by a first layer 10 of insulator, for example silicon nitride, and by a second layer 12 of insulator, for example silicon oxide. The conducting via 6 passes through the two layers 10 and 12 of insulators. The lower face of the strip 2 of phase-change material rests on insulators 14, through which the resistive elements 8 pass. This lower face is, for example, in contact with silicon nitride and silicon oxide.

FIG. 2B is a cross-sectional view along the line B-B in FIG. 2A and shows the cross section of three adjacent rows of the phase-change memory. Each strip 4 of conductive material lies on top of a strip 2 of phase-change material and is in contact with a conducting via 6 as has been previously described. The assemblies formed by each strip of phase-change material and the corresponding strip of conductive material are completely covered by insulator, with the exception of the contacts with the conducting vias 6 and the contacts with the resistive elements 8 represented as dashed lines and seen by transparency.

When a phase-change memory element is read, a current having a sufficiently low intensity so as not to cause any change of phase is sent between a resistive element 8 and the vias 6 in such a manner as to measure the resistance between them and hence to determine the value, 0 or 1, stored.

When a phase-change memory element is written, a current is sent between a resistive element 8 and the corresponding strip of conductive material 4 towards the vias 6. The intensity of this current is chosen in such a manner as to sufficiently increase the temperature of the selected resistive element 8 so that a region of the strip 2 of phase-change material in contact with the upper end of the resistive element 8 switches from the crystalline phase to the amorphous phase. It is, for example, considered that the crystalline phase corresponds to the value 0 and the amorphous phase corresponds to the value 1.

The smaller the surface area of the contact region between a resistive element 8 and the corresponding strip 2 of phase-change material, the lower the intensity of the current needed for programming. Contact regions of limited size therefore allow the time and the cost of programming to be reduced.

One means of decreasing the size of the contact regions is to reduce the width of the strips 2 of phase-change material. However, this causes problems during the formation of vias 6.

The vias 6 are formed by deposition of an etch mask having openings facing the strips of conductive material 4. The layers 10 and 12 of insulators are etched in such a manner as to form cavities reaching strips of conductive material 4. The cavities are, for example, filled with a cladding made of titanium nitride and with a core made of tungsten. The mask is subsequently removed.

Figure 3:
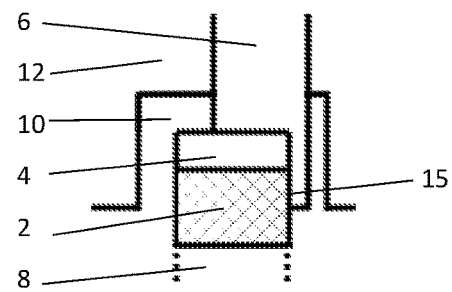
FIG. 3 is a partial view of one element of a phase-change memory.

FIG. 3 shows one element of a phase-change memory in which imprecisions in alignment are produced during the formation of the mask for etching the vias, in other words the openings were not correctly aligned with the strips of conductive material 4. Such imprecisions are more at risk of occurring, the smaller the width of the strips 4 of conductive material.

The etching of the layer of insulator 10 has opened up a region 15 on the side of the strip 2 of phase-change material. The region 15 constitutes a contact region between the via 6 and the phase-change material. This contact may for example lead to a variation in the resistance measured between a resistive element 8 and a via 6, in particular a variation in the measurements of the resistances corresponding to the amorphous and crystalline states which may no longer be in the intended ranges of values. Thus, the reading might not correspond to the state of the memory.

It would be desirable to provide a phase-change memory comprising a strip of phase-change material that may be of limited width allowing this problem to be overcome.

The formation of an etch-stop layer could, for example, be provided on the layer of insulator 10 made of a material whose etching is highly selective with respect to the material of the layer 10 of insulator.

Such an etch-stop layer may be formed in a conformal manner on the layer of insulator 10. Thus, the etching of the layer 10, after the selective etching of the etch-stop layer, is of sufficiently short duration so as not to reach the strip 2 of phase-change material.

The etch-stop layer may also be formed after a planarization step uncovering the strip 4 of conductive material. Thus, the selective etching of the etch-stop layer allows the strip 4 to be directly reached. The absence of a step for dry etching of the layer of insulator 10 eliminates the risk of reaching the strip 2 of phase-change material.

However, the two methods described hereinabove add fabrication steps. It would be desirable to provide a method that does not increase the number of steps of the fabrication method.

FIGS. 4A to 4D are cross-sectional views illustrating steps of one embodiment of a method for formation of the connections between a phase-change memory and a connection network. FIG. 4E is a cross-sectional view along the line E-E in FIG. 4D.

Figure 4A:
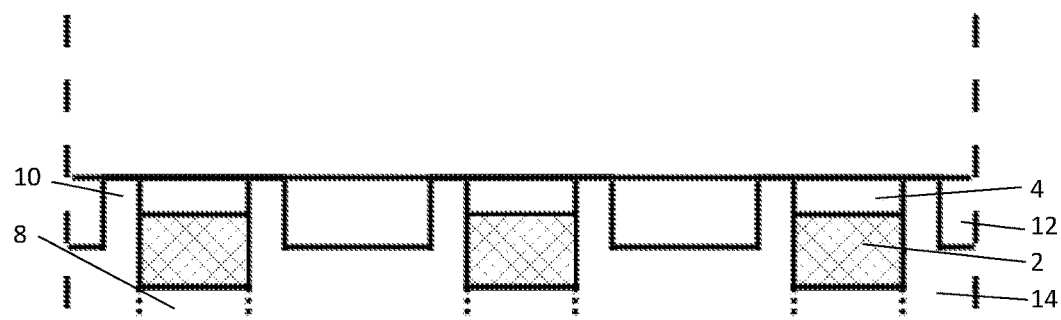
FIGS. 4A to 4D are cross-sectional views illustrating steps of one embodiment of a phase-change memory.

FIG. 4A illustrates the result of an initial fabrication step. The initial step is carried out based on a phase-change memory such as that described in relation to FIGS. 2A and 2B, but prior to the formation of the vias 6, in other words after the deposition of the layer of insulator 12.

The initial step is a planarization step carried out, for example, by chemical-mechanical polishing or CMP. During this step, the layers of insulators 10 and 12 are polished so as to uncover the upper faces of the strips 4 of conductive material.

Figure 4B:
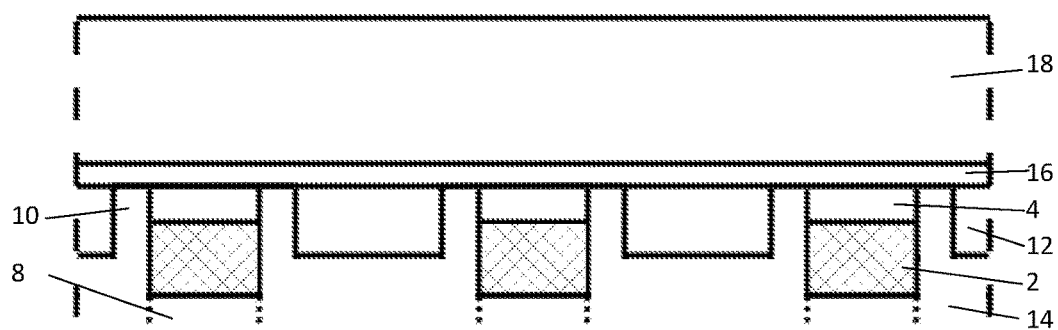

At the step illustrated in FIG. 4B, an etch-stop layer 16 is formed on the structure and is covered by a layer 18 of insulator, for example silicon oxide. The layer 16 has, for example, a thickness in the range between 5 and 20 nm, for example 10 nm.

The material of the etch-stop layer 16, for example $Al_2O_3$ or AlN, is chosen in such a manner that the etching of the material of the layer 18 of insulator is highly selective with respect to the material of the etch-stop layer 16 and that the etching of the material of the etch-stop layer 16 is highly selective with respect to the material of the layer 10 of insulator, for example silicon nitride.

Figure 4C:
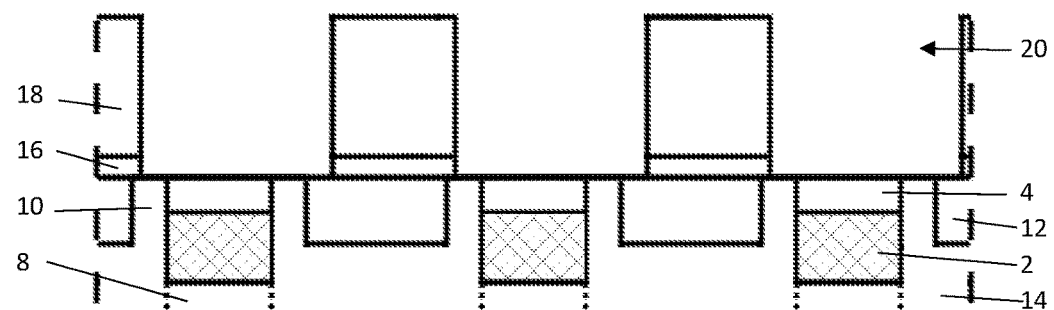

At the step illustrated in FIG. 4C, cavities 20 are formed in the etch-stop layer 16 and the layer of insulator 18. The width of the cavities 20 corresponds for example to the usual widths of the metallizations of the connection network, which, as is shown, are in general wider than the strip 2 of phase-change material and the strip 4 of conductive material.

Figure 4D:
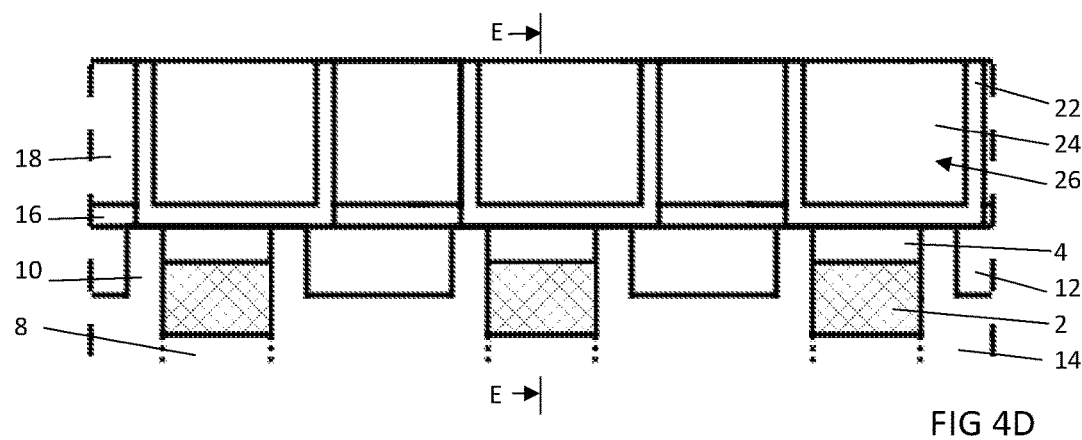
Figure 4E:
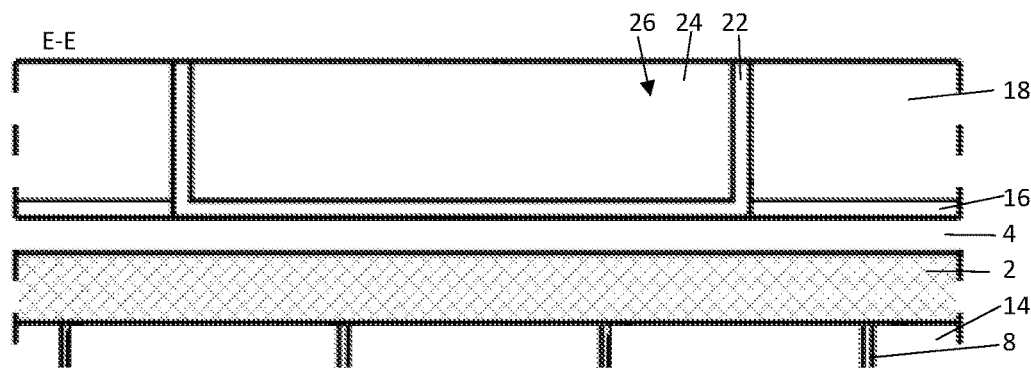
FIG. 4E is a cross-sectional view of the step illustrated in FIG. 4D in a plane orthogonal to that in FIG. 4D.

At the step illustrated in FIGS. 4D and 4E, the cavities 20 are filled with metallizations 26 forming a part of the lower level of the connection network. Each metallization 26 is therefore in direct contact with a strip 4 of conductive material. These metallizations 26 are generally composed of a cladding 22, for example made of TaN/Ta, and of a core 24, for example made of copper.

In FIG. 4E, only one metallization 26 has been shown on a strip 4 of conductive material. More generally, each strip 4 of conductive material is in contact with several metallizations in such a manner as to maintain a uniform voltage within each strip 4 of conductive material.

The width of the metallizations 26 that can be seen in FIG. 4D is greater than the width of the strips 4 of conductive material. Only a part of the metallizations 26 is in contact with the strip 4 of conductive material, the remainder resting on the layers of insulators 10 and 12. Indeed, the properties of etching selectivity of the material of the etch-stop layer 16 previously described greatly limit the etching of the insulator 10 surrounding the strip 2 of phase-change material, a fact which avoids the formation of problematic contacts between the metallizations 26 and the strips 2 of phase-change material.

It is therefore possible to reduce the width of the strips 4 and 2 of conductive material and of phase-change material, and hence the width of the contact regions between the resistive elements 8 and the strips 2 of phase-change material.

One advantage of this embodiment is that it does not require the formation of vias between the phase-change memory and the lower level of the connection network, and hence of an etch mask for vias. This makes the method less costly in terms of time and expense.

The integrated circuits comprising phase-change memories may also comprise logic elements, formed within and on the substrate, not shown. These logic elements are connected to the lower metallization level of the connection network by one or more conducting vias. In the case of the structure in FIGS. 4D and 4E, this or these conducting vias, not shown, has/have a height that is lower than what it/they ought to have in the case in FIGS. 2A and 2B. This reduction in height of the vias simplifies their implementation.

Many variants and modifications of this embodiment will be apparent to those skilled in the art. In particular, the material forming the etch-stop layer 16 may be replaced by other materials having similar properties.

The invention claimed is:

1. A phase-change memory, comprising:
    a plurality of phase-change structures, wherein each phase-change structure comprises:
        a strip of phase-change material; and
        a metal conductive strip on a top surface of the strip of phase-change material;
    a first insulator made of a first insulating material on sides of the metal conductive strips and the strips of phase-change material;
    a second insulator made of a second insulating material positioned in contact with and between first insulators of adjacent phase-change structures, said second insulating material being different from the first insulating material;
    wherein top surfaces of the strips of phase-change material, first insulator and second insulator are coplanar;
    an etch stop layer on the coplanar top surfaces of the metal conductive strips, the first insulator and the second insulator, wherein the etch stop layer is made of a third insulating material different from the first and second insulating materials;
    wherein the etch stop layer includes openings extending through the etch stop layer to the top surfaces of the metal conductive strips; and
    a metal connection structure filling each opening; and
    wherein the third insulating material is selectively etchable with respect to both the first and second insulating materials.

2. The phase-change memory of claim 1, wherein the metal connection structure is a component of a connection network composed of several levels of metallization.

3. The phase-change memory of claim 1, wherein the metal connection structure comprises: a metal liner layer lining side walls and a bottom of each opening; and a metal fill in contact with the metal liner layer.

4. The phase-change memory of claim 3, wherein the metal liner layer is a cladding made of tantalum nitride and the metal fill is a core made of copper.

5. The phase-change memory of claim 1, wherein said first insulating material is silicon nitride and said second insulating material is silicon oxide.

6. The phase-change memory of claim 5, wherein said third insulating material is selected from the group consisting of AlN and $Al_2O_3$.

7. The phase-change memory of claim 1, wherein the strip of phase-change material has a width and further has a length longer than the width, and wherein the metal conductive strip has a width and further has a length longer than the width, and wherein the widths of the strip of phase-change material and metal conductive strip are the same.

8. A method of fabricating a phase-change memory, comprising:
    forming a plurality of phase-change structures, wherein each phase-change structure comprises a conductive strip that covers a strip of phase-change material;
    insulating the phase-change structures from each other with a first insulator made of a first insulating material on sides of the conductive strips and the strips of phase-change material and a second insulator made of a second insulating material positioned in contact with and between first insulators of adjacent phase-change structures, said second insulating material being different from the first insulating material;
    planarizing the conductive strips, first insulator and second insulator to form a coplanar surface;
    depositing an etch-stop layer on the coplanar surface, wherein the etch stop layer is made of a third insulating material different from the first and second insulating materials, the third insulating material being selectively etchable with respect to both the first and second insulating materials;
    etching openings through the etch stop layer to uncover upper faces of the conductive strips; and
    forming elements of a lower metallization level of a connection network within the etched openings, in direct contact with upper faces of the conductive strip.

9. The method according to claim 8, wherein forming elements of the lower metallization level comprises: filling the etched openings with one or more metal materials.

10. The method according to claim 9, wherein filling the etched openings comprises depositing a cladding made of tantalum nitride and depositing a core made of copper.

11. The method according to claim 8, wherein the first insulating material is silicon nitride, the second insulating material is silicon oxide and the etch-stop layer is made of a material selected from the group consisting of $Al_2O_3$ and AlN.

12. The method according to claim 8, wherein a thickness of the etch-stop layer is in a range between 5 and 10 nm.

* * * * *